(12) United States Patent
Wei (10) Patent No.: US 12,549,175 B2
(45) Date of Patent: Feb. 10, 2026

(54) CORRELATED DOUBLE SAMPLING INTEGRATING CIRCUIT AND DATA CONVERTER

(71) Applicant: SHEN AN MICRO CO.LTD, Hangzhou (CN)

(72) Inventor: Mengzhao Wei, Hangzhou (CN)

(73) Assignee: SHEN AN MICRO CO. LTD, Hangzhou (CN)

( * ) Notice: Subject to any disclaimer, the term of this patent is extended or adjusted under 35 U.S.C. 154(b) by 56 days.

(21) Appl. No.: 18/611,763

(22) Filed: Mar. 21, 2024

(65) Prior Publication Data

US 2024/0413817 A1    Dec. 12, 2024

(30) Foreign Application Priority Data

Jun. 12, 2023   (CN) .......................... 202310684668.1

(51) Int. Cl.
*H03K 17/16* (2006.01)
*H03F 3/45* (2006.01)
*H03K 19/0175* (2006.01)

(52) U.S. Cl.
CPC ..... *H03K 17/16* (2013.01); *H03K 19/017509* (2013.01); *H03F 3/45475* (2013.01)

(58) Field of Classification Search
CPC .................. H03K 19/017509; H03K 17/16
See application file for complete search history.

(56) References Cited

U.S. PATENT DOCUMENTS 7,834,685 B1 * 11/2010 Pertijs ............ H03K 19/018521
327/124
7,924,062 B2 * 4/2011 Chiu ...................... H04N 25/78
327/337

(Continued)

FOREIGN PATENT DOCUMENTS

CN    103905750 A    7/2014
CN    104485897 A    4/2015

(Continued)

OTHER PUBLICATIONS

Zheng Bin, et al., A design of readout circuit for infrared focal plane array, Electronic Design Engineering, 2022, pp. 104-108, vol. 30 No. 15.

(Continued)

*Primary Examiner* — Menatoallah Youssef
*Assistant Examiner* — Khareem E Almo
(74) *Attorney, Agent, or Firm* — Bayramoglu Law Offices LLC (57) ABSTRACT

A Correlated Double Sampling (CDS) integrating circuit and a data converter, the CDS circuit includes a CDS integration module and a level shifting module. The CDS integration module is configured to sample a first input signal and an Operational Amplifier (Opamp) input offset voltage to a sampling capacitor during a first phase; and sample a second input signal and the Opamp input offset voltage to the sampling capacitor during a second phase, and transfer a charge difference generated on the sampling capacitor to an integrating capacitor. The level shifting module is configured to sample an output signal and a common-mode voltage to a level shifting capacitor during a first stage of the first phase and the second phase, and shift a potential of an Opamp output voltage towards the common-mode voltage (Continued)

through the level shifting capacitor in a second stage of the second phase.

6 Claims, 6 Drawing Sheets

(56) References Cited

U.S. PATENT DOCUMENTS

| | | | | |
|---|---|---|---|---|
| 8,400,339 | B2* | 3/2013 | Garrity | ............... H03G 1/0094 |
| | | | | 341/150 |
| 8,841,962 | B1 | 9/2014 | Trampitsch | |
| 2011/0012644 | A1* | 1/2011 | Chiu | .................... G11C 27/026 |
| | | | | 327/94 |
| 2012/0249237 | A1* | 10/2012 | Garrity | .............. H03F 3/45986 |
| | | | | 330/127 |
| 2013/0293294 | A1* | 11/2013 | Lyden | .................... H03G 3/008 |
| | | | | 330/69 |
| 2019/0356290 | A1* | 11/2019 | Garrity | ................ H03G 3/3089 |
| 2023/0336894 | A1* | 10/2023 | Akebono | .............. H03M 1/123 |
| 2024/0213972 | A1* | 6/2024 | Simony | .................. H04N 25/78 |

FOREIGN PATENT DOCUMENTS

| | | |
|---|---|---|
| CN | 108322192 A | 7/2018 |
| JP | 2012085133 A | 4/2012 |

OTHER PUBLICATIONS

Lukang Shi, et al., Noise-Shaping SAR ADC Using a Two-Capacitor Digitally Calibrated DAC With 82.6-dB SNDR and 90.9-dB SFDR, IEEE Transactions on Circuits and Systems-I: Regular Papers, 2021, pp. 4001-4012, vol. 68 No. 10.

* cited by examiner

CORRELATED DOUBLE SAMPLING INTEGRATING CIRCUIT AND DATA CONVERTER

CROSS REFERENCE TO RELATED APPLICATIONS

This application is based upon and claims priority to Chinese Patent Application No. 202310684668.1 filed on Jun. 12, 2023, the entire contents of which are hereby incorporated by reference.

TECHNICAL FIELD

Embodiments of the disclosure relate to the technical field of integrated circuits, and in particular to a Correlated Double Sampling (CDS) integrating circuit and a data converter.

BACKGROUND

Integrators are widely used in precision data conversion systems. Switched-Capacitor (SC) integrators based on Operational Amplifiers (Opamps) have attracted attention due to their robustness against temperature, voltage and process variations. However, the SC integrators can only achieve the ideal performance when the characteristics of the Opamp are close to an ideal (i.e., high gain, low offset voltage and noise, high speed, and wide swing).

CDS technique may significantly reduce an offset voltage and flicker noise of a system, and improve a Signal to Noise Ratio (SNR) of the system by doubling the amplitude of an input signal. Therefore, the CDS integrators based on the CDS technique have emerged. However, due to the relatively small intrinsic gain of a Metal-Oxide-Semiconductor Field-Effect Transistor (MOS) device in the Opamp at an advanced process node and the relatively low operational power supply voltage, the gain of the Opamp is limited at the advanced process node. The limited gain of the Opamp may limit the effectiveness of the CDS integrator in cancelling the offset voltage, resulting in integrator leakage.

In summary, the integrator leakage caused by the non-ideal characteristics of the Opamp has become an urgent problem to be solved.

SUMMARY

Embodiments described herein provide a CDS integrating circuit and a data converter to solve the problem of integrator leakage caused by the non-ideal characteristics of an Opamp.

According to a first aspect of the disclosure, a CDS integrating circuit is provided. The CDS integrating circuit integrates a difference between a first input signal and a second input signal to obtain an output signal, and the CDS integrating circuit includes a CDS integration module and a level shifting module. The CDS integration module is configured to sample the first input signal and an Opamp input offset voltage to a sampling capacitor during a first phase; and sample the second input signal and the Opamp input offset voltage to the sampling capacitor during a second phase, and transfer a charge difference generated on the sampling capacitor to an integrating capacitor. The first phase and the second phase are two stages controlled by a first clock signal and a second clock signal that are non-overlapping, and the Opamp input offset voltage herein refers to an input offset voltage of a first Opamp. The level shifting module is configured to sample the output signal and a common-mode voltage to a level shifting capacitor during a first phase and a first stage of the second phase, and shift an Opamp output voltage towards the common-mode voltage through the level shifting capacitor during a second stage of the second phase, so as to increase an equivalent loop gain.

Optionally, the CDS integration module includes: two first switches, two second switches, a third switch, the sampling capacitor, the integrating capacitor, the first Opamp, and a first offset voltage source. One end of the first first switch is coupled to the first input signal, and the other end of the first first switch is coupled to one end of the sampling capacitor. One end of the first second switch is coupled to the second input signal, and the other end of the first second switch is coupled to one end of the sampling capacitor. One end of the second first switch is respectively coupled to one end of the first offset voltage source and one end of the second second switch, the other end of the second first switch is respectively coupled to the output signal, one end of the integrating capacitor, and the level shifting module, and a voltage corresponding to the first offset voltage source is the Opamp input offset voltage. The other end of the second second switch is coupled to the other end of the integrating capacitor. One end of the third switch is coupled to the other end of the sampling capacitor, and the other end of the third switch is coupled to one end of the second second switch. A positive input end of the first Opamp is coupled to the common-mode voltage, a negative input end of the first Opamp is coupled to the other end of the first offset voltage source, and an output end of the first Opamp is coupled to the level shifting module.

Optionally, the level shifting module includes: two fourth switches, a first fifth switch, and the level shifting capacitor. One end of the first fourth switch is coupled to the common-mode voltage, and the other end of the first fourth switch is respectively coupled to one end of the first fifth switch and one end of the level shifting capacitor. One end of the second fourth switch is respectively coupled to the output end of the first Opamp and the other end of the first fifth switch, and the other end of the second fourth switch is respectively coupled to the CDS integration module, the other end of the level shifting capacitor, and the output signal.

Optionally, the level shifting module includes: three fourth switches, a second fifth switch, a sixth switch, the level shifting capacitor, a second Opamp, an energy storage capacitor, and a second offset voltage source. One end of the third fourth switch is coupled to one end of the second second switch and one end of the energy storage capacitor, and the other end of the third fourth switch is respectively coupled to one end of the first offset voltage source, one end of the second first switch, and one end of the second fifth switch. One end of the fourth fourth switch is respectively coupled to the output end of the first Opamp and the other end of the second fifth switch, and the other end of the fourth fourth switch is coupled to one end of the level shifting capacitor, the output signal, and the CDS integration module. One end of the fifth fourth switch is respectively coupled to one end of the sixth switch and one end of the second offset voltage source, the other end of the fifth fourth switch is coupled to the other end of the level shifting capacitor and the output end of the second Opamp, and the second offset voltage source corresponds to an input offset voltage of the second Opamp. The other end of the sixth switch is coupled to the other end of the energy storage capacitor. A negative input end of the second Opamp is coupled to the other end of the second offset voltage source, and a positive input end of the second Opamp is coupled to the common-mode voltage.

Optionally, An on stage of the first switch corresponds to the first phase, and the first switch is controlled by the first clock signal. An on stage of the second switch corresponds to the second phase, and the second switch is controlled by the second clock signal. The third switch is controlled by a third clock signal, and the third clock signal is a control signal which is at a low level during the switching between the first phase and the second phase.

Optionally, the fourth switch is controlled by a fourth clock signal, and the fourth clock signal is a control signal which is at a high level during the first phase and the first stage of the second phase, and is at a low level during the second stage of the second phase. The first fifth switch is controlled by a fifth clock signal, and the fifth clock signal and the fourth clock signal are non-overlapping clock signals.

Optionally, the fourth switch is controlled by a fourth clock signal, and the fourth clock signal is a control signal which is at a high level during the first phase and the first stage of the second phase, and is at a low level during the second stage of the second phase. The second fifth switch is controlled by the fifth clock signal, and the fifth clock signal and the fourth clock signal are non-overlapping clock signals. The sixth switch is controlled by a sixth clock signal, and the sixth clock signal is a control signal which is at a high level during the first phase and the second stage of the second phase, and is at a low level during the first stage of the second phase.

Optionally, the loop gain is:

$$(C1/C\_int)^2 * A1^2$$

Where C1 is a capacitance value of the sampling capacitor, C_int is a capacitance value of the integrating capacitor, and A1 is an open-loop gain of the first Opamp.

Optionally, the loop gain is:

$$(C1/C\_int)^2 * A1 * A2$$

Where C1 is the capacitance value of the sampling capacitor, C_int is the capacitance value of the integrating capacitor, A1 is the open-loop gain of the first Opamp, A2 is an open-loop gain of the second Opamp, and the open-loop gain of the second Opamp is greater than that of the first Opamp.

According to a second aspect of the disclosure second, a data converter is provided, which includes the CDS integrating circuit as described in any one of the above in the first aspect.

In the CDS integrating circuit and the data converter provided by the embodiments of the disclosure, the CDS integrating circuit adds the level shifting module on the basis of the original CDS integrating circuit (i.e., the CDS integration module in the embodiments of the disclosure), the level shifting module samples the output signal and the common-mode voltage to the level shifting capacitor during the first phase and the first stage of the second phase, and shifts the potential of the Opamp output voltage in the direction of the common-mode voltage through the level shifting capacitor during the second stage of the second phase, so as to increase the loop gain. The loop gain is increased to improve the effectiveness of the CDS integration module in canceling the offset voltage, thereby improving the problem of integrator leakage.

BRIEF DESCRIPTION OF THE DRAWINGS

To describe the technical solutions in the embodiments of the disclosure more clearly, the following briefly describes the drawings required for describing the embodiments. It is to be known that following drawings in the following description show merely some embodiments of the disclosure, rather than limiting the disclosure.

Elements in the drawings are schematic and not drawn to scale.

DETAILED DESCRIPTION OF THE EMBODIMENTS

In order to make the purpose, technical solutions, and advantages of the embodiments of the disclosure clearer, the technical solutions in the embodiments of the disclosure will be described clearly and completely below with reference to the drawings. It is apparent that the described embodiments are part rather than all embodiments of the disclosure. On the basis of the description of the embodiments of the disclosure, all other embodiments obtained by those skilled in the art without creative work shall fall within the scope of protection of the disclosure.

Unless otherwise defined, all terms used herein (including technical and scientific terms) have the same meanings as those commonly understood by those skilled in the art that the subject of the disclosure belongs. Further, it is to be understood that terms such as those defined in commonly used dictionaries should be interpreted as having the meanings consistent with those in the context of the specification and related technologies, and will not be interpreted in an idealized or overly formal form, unless otherwise defined herein. As used herein, the statement that two or more parts are "connected" or "coupled" together shall mean that these parts are combined directly or through one or more intermediate parts. In addition, terms such as "first" and "second" are only used for distinguishing one component (or one part of a component) from another component (or another part of a component). In addition, terms such as "first" and "second" are only used for distinguishing one component (or one part of a component) from another component (or another part of a component).

Figure 1:
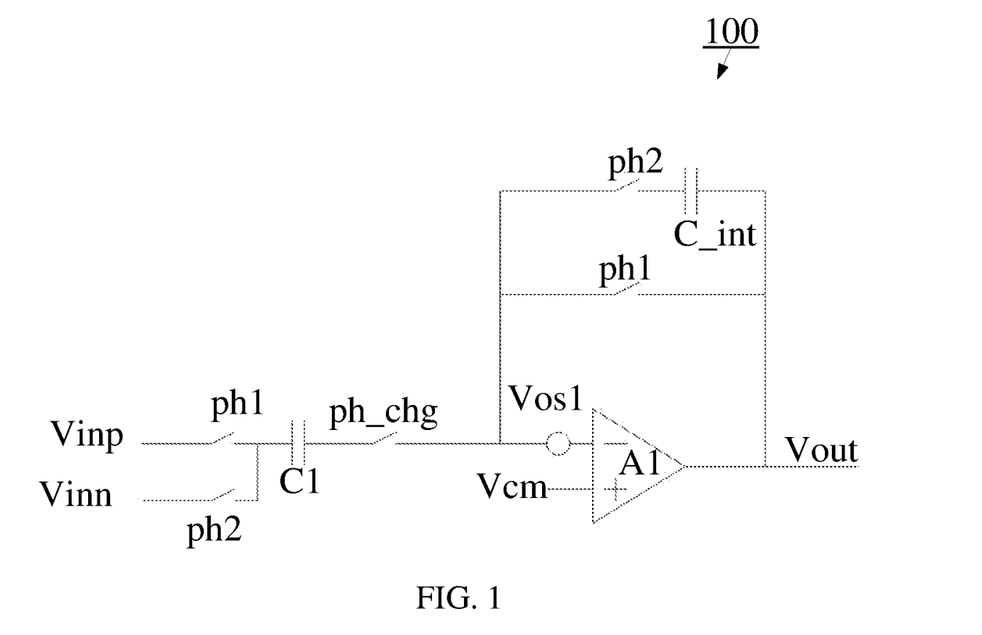
FIG. 1 is an exemplary circuit diagram of an existing CDS integrator.

As shown in FIG. 1, which is an exemplary circuit diagram of an existing CDS integrator 100. In FIG. 1, an offset voltage Vos1 is jointly caused by a device mismatch in an Opamp and an open-loop gain A1 of the Opamp. A value of Vos1 may be expressed as:

$$Vos1 = Vos\_mis + (Vout - Vcm) * \frac{1}{1 + \left(\frac{C1}{C\_int}\right) * A1}$$

Where Vos_mis is an offset voltage caused by the device mismatch, Vout is an output voltage, Vcm is a common-mode voltage, C1 is a capacitance value of a sampling capacitor C1, C_int is a capacitance value of an integrating capacitor C_int, and the second item is an offset voltage caused by a finite gain A1 of the Opamp.

In the above formula, Vos_mis in the first part is usually a constant value during circuit operation, and $$(Vout - Vcm) * \frac{1}{1 + \left(\frac{C1}{C\_int}\right) * A1}$$

in the second part is affected by the output voltage Vout.

During a phase ph1, the input voltage Vinp is sampled by a left plate of the capacitor C1, the Opamp A1 is configured for unity gain feedback, and the input offset voltage Vos1 thereof is sampled by a right plate of the capacitor C1.

A phase ph_chg is inserted between the phase ph1 and a phase ph2 phase to eliminate the effect of the input signal on charge injection during the switching between the phase ph1 and the phase ph2.

During the phase ph2, the input voltage Vinn is sampled by the capacitor C1, and the Opamp A1 is configured in a capacitive feedback mode. The charge stored on C1 is transferred to C_int, while the offset voltage stored on C1 is:

$$Vos1 * \frac{\left(\frac{C1}{C\_int}\right) * A1}{1 + \left(\frac{C1}{C\_int}\right) * A1}$$

Where (C1/C_int)*A1 is a loop gain. A residual error is:

$$Verr_{res} = Vos1 - Vos1 * \frac{\left(\frac{C1}{C\_int}\right) * A1}{1 + \left(\frac{C1}{C\_int}\right) * A1} = Vos1 * \frac{1}{1 + \left(\frac{C1}{C\_int}\right) * A1}$$

A corresponding voltage value to obtain each integral is:

$$Vout\_acc = \left(\frac{C1}{C\_int}\right) * (Vinp - Vinn) - Verr\_res$$

As can be seen from the above formula, if the gain A1 is high enough, then the residual error Verr_res approaches 0, and the corresponding voltage transferred from C1 to C_int in each cycle is (C1/C_int)*(Vinp-Vinn). However, due to the limitation of the gain A1 under a low voltage process (due to the relatively small intrinsic gain of an MOS device in the Opamp at an advanced process node and the relatively low operational power supply voltage, the gain of the Opamp at the advanced process node is negatively affected), the offset voltage Vos1 itself may change with the output voltage Vout, and Verr_res is further affected by the gain A1 of the Opamp. Therefore, the effect of eliminating the offset voltage of the CDS integrator in FIG. 1 may not be ideal due to the limited loop gain provided by A1, thereby causing the problem of integrator leakage. That is, the CDS integrator still contributes non-linearity during integration.

In order to solve the problem of integrator leakage caused by the fact that the limited loop gain provided by A1 may not be ideal in FIG. 1, the embodiments of the disclosure provide an improved CDS integrating circuit. The CDS integrating circuit in the embodiments of the disclosure is equivalent to adding a level shifting module for increasing a loop gain on the basis of an existing CDS integrator. The level shifting module is implemented based on Correlated Level Shifting (CLS) technique The loop gain is increased to improve the effectiveness of the CDS integration module in canceling the offset voltage, thereby improving the problem of integrator leakage. The CDS integrating circuit of the disclosure will be described in detail below.

Figure 2:
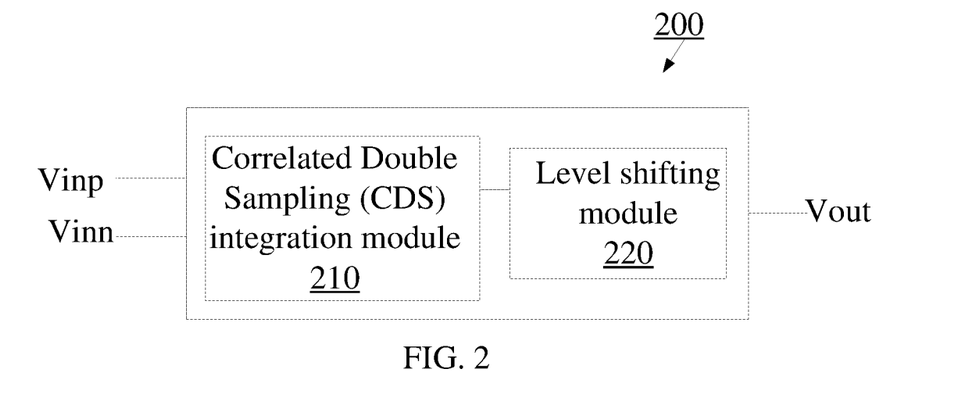
FIG. 2 shows a schematic block diagram of a CDS integrating circuit according to an embodiment of the disclosure.

FIG. 2 shows a schematic block diagram of a CDS integrating circuit 200 according to an embodiment of the disclosure, as shown in FIG. 2, the CDS integrating circuit 200 integrates a difference between a first input signal Vinp and a second input signal Vinn to obtain an output signal Vout, and the CDS integrating circuit 200 includes a CDS integration module 210 and a level shifting module 220.

The CDS integration module 210 receives the first input signal Vinp and the second input signal Vinn, and is coupled to the level shifting module 220. The CDS integration module 210 is configured to sample the first input signal Vinp and an Opamp input offset voltage Vos1 to a sampling capacitor C1 during a first phase; and sample the second input signal Vinn and the Opamp input offset voltage Vos1 to the sampling capacitor C1 during a second phase, and transfer a charge difference generated on the sampling capacitor C1 to an integrating capacitor C_int. The first phase and the second phase are two stages controlled by a first clock signal and a second clock signal that are non-overlapping, and the Opamp input offset voltage Vos1 is an input offset voltage of a first Opamp A1. In the embodiments of the disclosure, the CDS integration module 210 is the same as a CDS integrator 100 in FIG. 1. The first phase is a sampling stage and the second phase is an integration stage. The two input signals are alternately input to enable the amount of charge stored on the sampling capacitor C1 to be correlated with the difference between the first input signal Vinp and the second input signal Vinn, thereby eliminating the influence of the offset voltage. However, due to the limitation of the open-loop gain of the first Opamp A1, the effect of eliminating the offset voltage is not ideal.

The level shifting module 220 is based on CLS technique. The level shifting module 220 is configured to sample the output signal Vout and a common-mode voltage Vcm to a level shifting capacitor C_cls during a first stage of the first phase and the second phase, and shift a potential of an Opamp output voltage towards the common-mode voltage Vcm through the level shifting capacitor C_cls in a second stage of the second phase, so as to increase a loop gain. In the embodiments of the disclosure, the level shifting module 220 divides the second phase into two stages, which is equivalent to using the first Opamp A1 twice, thereby increasing the loop gain.

The CDS integrating circuit in the embodiments of the disclosure adds the level shifting module 220 on the basis of the original CDS integrating circuit 100 (i.e., the CDS integration module 210 in the embodiments of the disclosure), the level shifting module 220 samples the output signal Vout and the common-mode voltage Vcm to the level shifting capacitor C_cls during the first stage of the first phase and the second phase, and shifts the potential of the Opamp output voltage towards the common-mode voltage Vcm through the level shifting capacitor C_cls in the second stage of the second phase, so as to increase the loop gain. The loop gain is increased to improve the effectiveness of the CDS integration module 210 in canceling the offset voltage, thereby solving the problem of integrator leakage.

Figure 3:
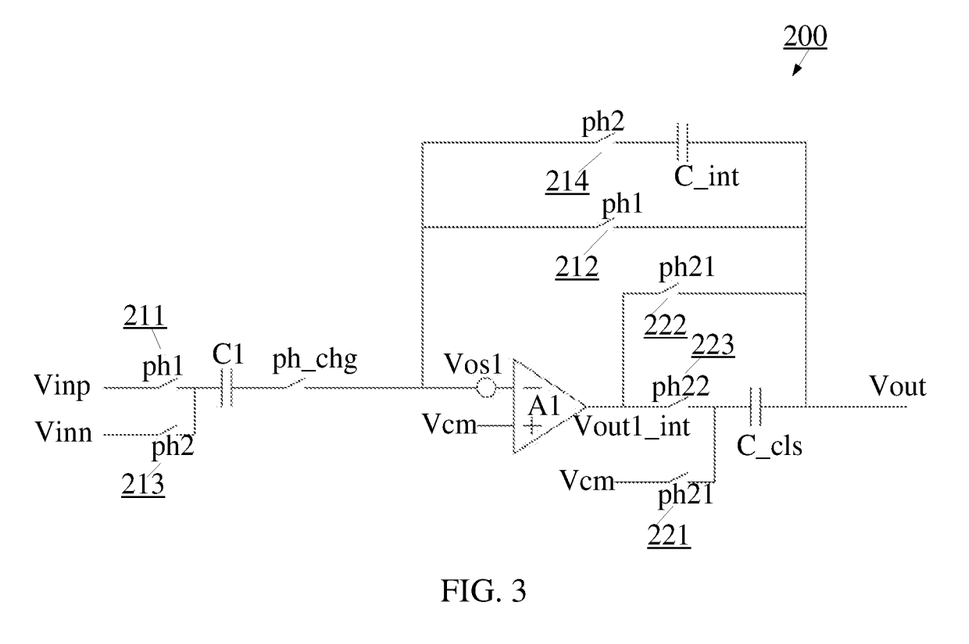
FIG. 3 shows an exemplary circuit diagram of a CDS integrating circuit according to an embodiment of the disclosure.

Further, FIG. 3 shows an exemplary circuit diagram of a CDS integrating circuit 200 according to an embodiment of the disclosure. As shown in FIG. 3, the CDS integration module 210 includes: two first switches ph1 (211 and 212), two second switches ph2 (213 and 214), a third switch ph_chg, the sampling capacitor C1, the integrating capacitor C_int, the first Opamp A1, and a first offset voltage source Vos1. One end of the first first switch 211 is coupled to the first input signal Vinp, and the other end of the first first switch 211 is coupled to one end of the sampling capacitor C1. One end of the first second switch 213 is coupled to the second input signal Vinn, and the other end of the first second switch 213 is coupled to one end of the sampling capacitor C1. One end of the second first switch 212 is respectively coupled to one end of the first offset voltage source Vos1 and one end of the second second switch 214, the other end of the second first switch 212 is respectively coupled to the output signal Vout, one end of the integrating capacitor C_int, and the level shifting module 220, and a voltage corresponding to the first offset voltage source Vos1 is the Opamp input offset voltage Vos1. The other end of the second second switch 214 is coupled to the other end of the integrating capacitor C_int. One end of the third switch ph_chg is coupled to the other end of the sampling capacitor C1, and the other end of the third switch ph_chg is coupled to one end of the second second switch 214. A positive input end of the first Opamp A1 is coupled to the common-mode voltage Vcm, a negative input end of the first Opamp A1 is coupled to the other end of the first offset voltage source Vos1, and an output end Vout1_int of the first Opamp A1 is coupled to the level shifting module 220. A closing stage of the first switch ph1 corresponds to the first phase, and the first switch ph1 is controlled by the first clock signal. A closing stage of the second switch ph2 corresponds to the second phase, and the second switch ph2 is controlled by the second clock signal. The third switch ph_chg is controlled by a third clock signal, and the third clock signal is a control signal which is at a low level during the switching between the first phase and the second phase.

As shown in FIG. 3, the level shifting module 220 includes: two fourth switches ph21 (221 and 222), a first fifth switch ph22 (223), and the level shifting capacitor C_cls. One end of the first fourth switch 221 is coupled to the common-mode voltage Vcm, and the other end of the first fourth switch 221 is respectively coupled to the first fifth switch 223 and one end of the level shifting capacitor C_cls. One end of the second fourth switch 222 is respectively coupled to the output end Vout1_int of the first Opamp A1 and the other end of the first fifth switch 223, and the other end of the second fourth switch 222 is respectively coupled to the CDS integration module 210 (specifically coupled to one end of the integrating capacitor C_int in the CDS integration module 210), the other end of the level shifting capacitor C_cls, and the output signal Vout. The fourth switch ph21 is controlled by a fourth clock signal, and the fourth clock signal is a control signal which is at a high level during the first phase and the first stage of the second phase, and is at a low level during the second stage of the second phase. The first fifth switch ph22 is controlled by a fifth clock signal, and the fifth clock signal and the fourth clock signal are non-overlapping clock signals.

Figure 4:
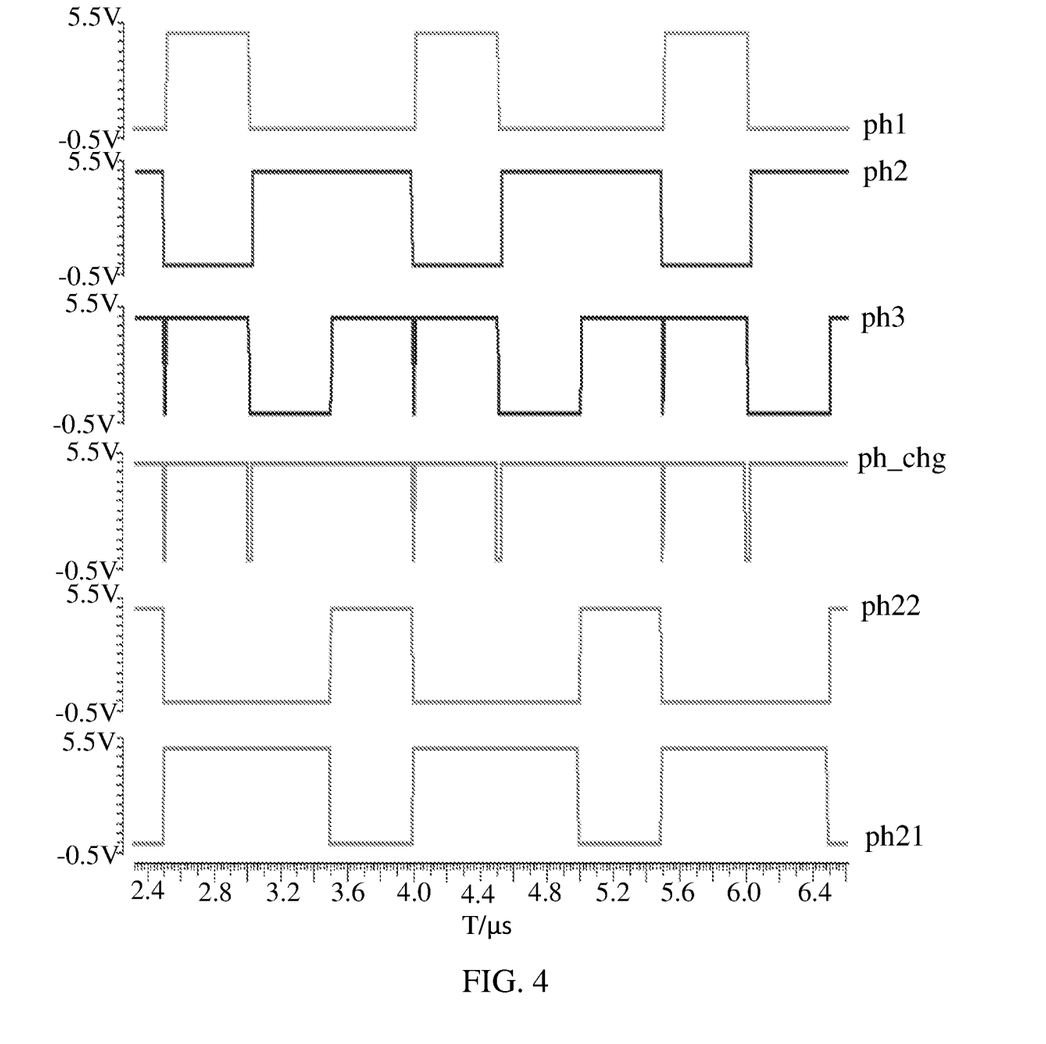
FIG. 4 shows a timing diagram corresponding to each switch of a CDS integrating circuit according to an embodiment of the disclosure.

A circuit principle of the CDS integrating circuit in the embodiments of the disclosure is described in conjunction with FIG. 3. FIG. 4 shows a timing diagram corresponding to each switch in FIG. 3, where a high level indicates that the switch is in an on state, and a low level indicates that the switch is in an off state, which will be described in conjunction with FIG. 3 and FIG. 4. During the first phase, that is, the first switch ph1 is in the on state, the second switch ph2 is in the off state, and the third switch ph_chg is in the on state, the circuit is configured in a unity gain feedback mode to sample the first input signal Vinp and the Opamp input offset voltage Vos1 to the sampling capacitor C1. During the second phase, that is, the first switch ph1 is in the off state, the second switch ph2 is the on state, and the third switch ph_chg is in the on state (it is to be noted that the third switch ph_chg is at a low level during the switching between the first switch ph1 and the second switch ph2 to eliminate the influence of the input signal on charge injection during the switching). The circuit operates in the capacitive feedback mode to sample the second input signal Vinn and the Opamp input offset voltage Vos1 to the sampling capacitor C1, and transfer the generated charge variation C1*(Vinp-Vinn) to the integrating capacitor C_int. During the first stage of the second phase, the fourth switch ph21 is in the on state, the fifth switch ph22 is in the off state, and the level shifting capacitor C_cls samples the output signal Vout and the common-mode voltage Vcm, namely sampling (Vout-Vcm). During the first stage of the second phase, the output Vout1_int of the first Opamp A1 is short-circuited with the output signal Vout (that is, a voltage value of the output signal Vout is equal to a voltage value of the output end Vout1_int of the first Opamp A1), which is the same as a calculation principle of the corresponding residual error in FIG. 1, and the residual error is Verr_res_ph21 at the end of the first stage of the second phase.

$$\text{Verr\_res\_ph21} = \text{Vos1\_ph21} * \frac{1}{1 + \left(\frac{C1}{C\_int}\right) * A1}$$

Where Vos1_ph21 is a value of the Opamp input offset voltage Vos1 corresponding to the first stage.

$$\text{vos1\_ph21} = \text{Vos\_mis} + (\text{Vout\_ph21} - Vcm) * \frac{1}{1 + \left(\frac{C1}{C\_int}\right) * A1}$$

Where Vos_mis is an offset voltage caused by the device mismatch, Vcm is a value of the common-mode voltage, C1 is a capacitance value of the sampling capacitor C1, C_int is a capacitance value of the integrating capacitor C_int, Vout_ph21 is a voltage value of the corresponding output signal Vout at the end of the first stage, and A1 is the open-loop gain of the first Opamp A1.

At this time, one end (left plate) of the level shifting capacitor C_cls is charged to Vcm, while the voltage Vcls_ph21 at both ends of the level shifting capacitor C_cls is:

$$Vcls\_ph21 = Vout\_ph21 - Vcm$$

During the second stage of the second phase, the fourth switch ph21 is in the off state, and the fifth switch ph22 is in the on state. At this time, one end (left plate) of the potential shift capacitor C_cls is connected to the output end Vout1_int of the first Opamp A1, that is, Vout1 int is shifted in the direction of Vcm to realize the CLS function. Due to the existence of feedback, the voltage value of the output Vout1_int of the first Opamp A1 may change from Vout_ph21 to Vout_int_ph22.

$$Vout1\_int\_ph22 = Vout\_ph21 * \frac{1}{1 + \left(\frac{C1}{C\_int}\right)*A1} + Vcm * \frac{\left(\frac{C1}{C\_int}\right)*A1}{1 + \left(\frac{C1}{C\_int}\right)*A1}$$

In each cycle, the output signal Vout of the integrating circuit is output at the end of the second stage of the second phase, and appears at the other end (right plate) of the level shifting capacitor C_cls. The final residual error at the end of the second stage is Verr_res_ph22:

$$Verr\_res\_ph22 = Vos\_mis + (Vout1\_int\_ph22 - Vcm) * \frac{1}{1 + \left(\frac{C1}{C\_int}\right)*A1} =$$

$$Vos\_mis + (Vout\_ph21 - Vcm) * \frac{1}{\left[1 + \left(\frac{C1}{C\_int}\right)*A1\right]^2}$$

As can be seen from the above formula, the influence of the output voltage on the residual error is divided by [1+(C1/C_int)*A1] 2 times, while the output voltage Vout1_int of the first Opamp A1 is shifted towards Vcm by the level shifting capacitor C_cls. Therefore, the CLS operation changes the loop gain of the circuit in the second stage of the second phase to:

$$(C1/C\_int)^2 * A1^2$$

Compared with the loop gain ((C1/C_int)*A1) shown in FIG. 1, the loop gain is improved by (C1/C_int)*A1 times, and the requirements for the open-loop gain A1 of the first Opamp A1 are greatly relaxed. That is, under the same open-loop gain, the loop gain in the embodiments of the disclosure may be larger, so that the effect of eliminating the offset voltage may be greatly improved, thereby solving the problem of integrator leakage.

Figure 5:
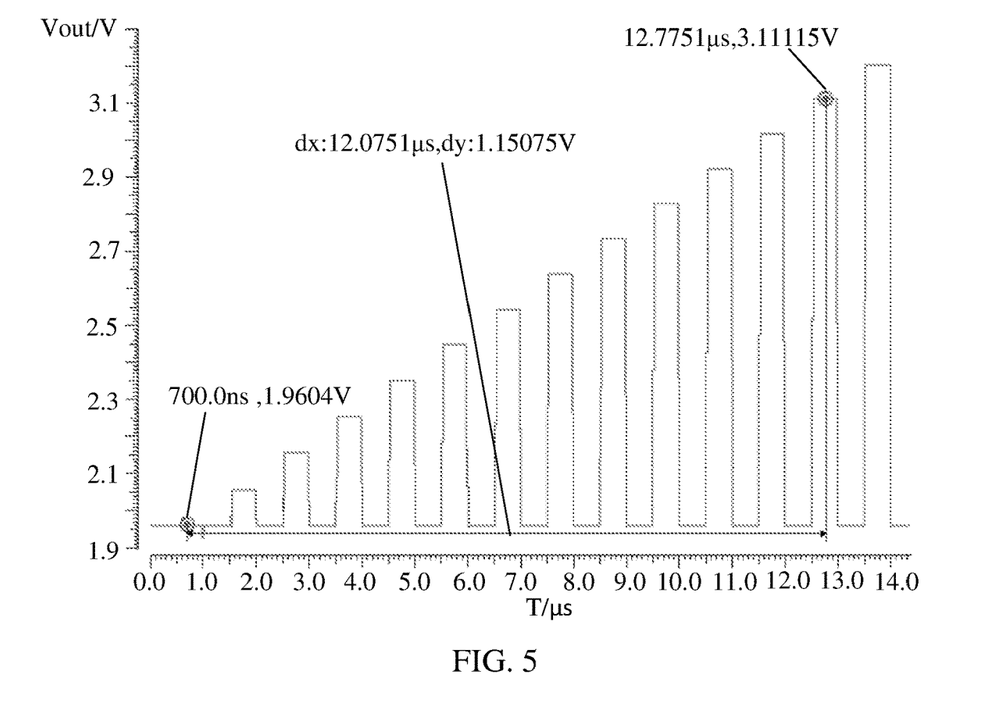
FIG. 5 shows a schematic diagram of a waveform corresponding to a CDS integrator in FIG. 1.
Figure 6:
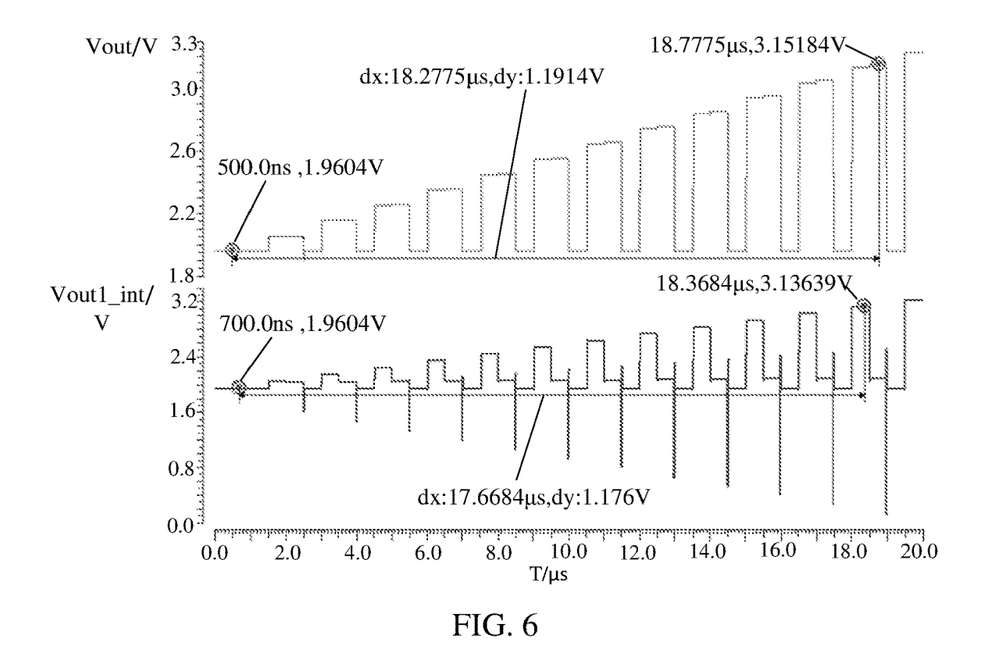
FIG. 6 shows a schematic diagram of waveforms corresponding to a CDS integrating circuit in FIG. 3.

In order to further describe the beneficial effect of the CDS integrating circuit 200 in the embodiments of the disclosure, the diagrams of simulation waveforms corresponding to FIG. 1 and FIG. 3 under the same parameters (assuming that the difference between the first input signal Vinp and the second input signal Vinn is 200 mv, a capacitance ratio of the integrating capacitor C_int to the sampling capacitor C1 is 2, and the open-loop gain of the first Opamp A1 is 40 dB) are given respectively. As shown in FIG. 5, which is a schematic diagram of a waveform of the output signal Vout corresponding to the CDS integrator 100 in FIG. 1. As shown in FIG. 6, which is a schematic diagram of waveforms of the output signal Vout corresponding to the CDS integrating circuit 200 in FIG. 3 and the output end Vout1_int of the first Opamp A1. After 12 integrations, the final integration cumulative result of the output signal Vout in an ideal state should be 1.2 V. Compared with FIG. 5 and FIG. 6, it can be seen that the cumulative change of the output signal Vout in FIG. 5 is 1.15 V, which is different from the ideal value of 1.2 V. The cumulative change of the output signal Vout in FIG. 6 is 1.191 V, which is closer to the ideal value of 1.2 V than that in FIG. 5, so that the effect of eliminating the offset voltage of the CDS integrating circuit 200 in FIG. 3 is better. In addition, as can be seen from the diagram of the waveform of the output end Vout1_int of the first Opamp A1 in FIG. 6, the swing of Vout1_int is relatively large, so that the first Opamp A1 must have a wide output swing due to the fact that Vout1_int may gradually move closer to a power rail on one side during the first stage of the second phase of each cycle.

Figure 7:
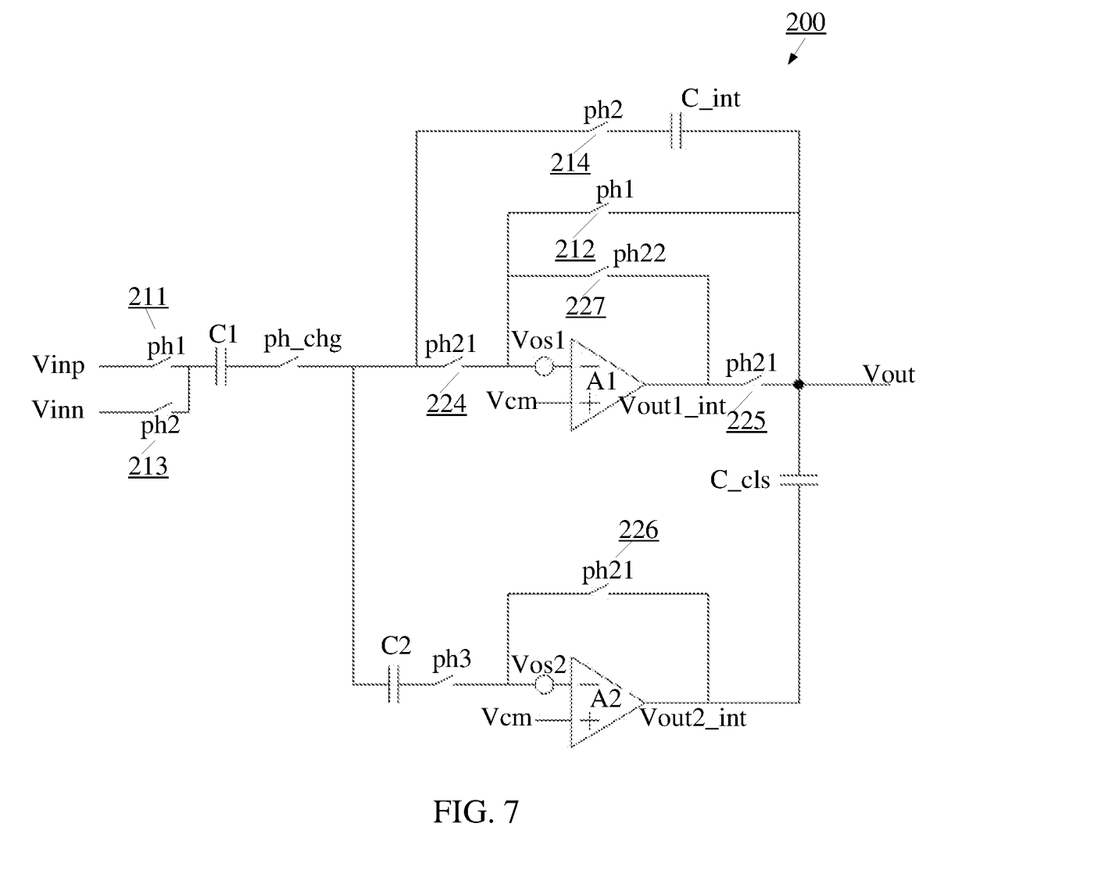
FIG. 7 shows an exemplary circuit diagram of another CDS integrating circuit according to an embodiment of the disclosure.

In order to further solve the problem of integrator leakage, FIG. 7 shows an exemplary circuit diagram of another CDS integrating circuit 200 according to an embodiment of the disclosure. FIG. 7 makes a further improvement on the basis of FIG. 3, so that the loop gain may be further increased. As shown in FIG. 7, the level shifting module 220 includes: three fourth switches ph21 (224, 225, and 226), a second fifth switch ph22 (227), a sixth switch ph3, the level shifting capacitor C_cls, a second Opamp A2, an energy storage capacitor C2, and a second offset voltage source Vso2. One end of the third fourth switch 224 is coupled to one end of the second second switch 214 and one end of the energy storage capacitor C2, and the other end of the third fourth switch 224 is respectively coupled to one end of the first offset voltage source Vos1, one end of the second first switch 212, and one end of the second fifth switch 227. One end of the fourth fourth switch 225 is respectively coupled to the output end Vout1_int of the first Opamp A1 and the other end of the second fifth switch 227, and the other end of the fourth fourth switch 225 is coupled to one end of the level shifting capacitor C_cls, the output signal Vout, and the CDS integration module 210 (specifically coupled to one end of the integrating capacitor C_int in the CDS integration module 210). One end of the fifth fourth switch 226 is coupled to one end of the sixth switch ph3 and one end of the second offset voltage source Vos2, the other end of the fifth fourth switch 226 is coupled to the other end of the level shifting capacitor C_cl and the output end Vout2_int of the second Opamp A2, and the second offset voltage source Vos2 corresponds to an input offset voltage of the second Opamp A2. The other end of the sixth switch ph3 is coupled to the other end of the energy storage capacitor C2. A negative input end of the second Opamp A2 is coupled to the other end of the second offset voltage source Vos2, and a positive input end of the second Opamp A2 is coupled to the common-mode voltage Vcm. The fourth switch ph21 is controlled by a fourth clock signal, and the fourth clock signal is a control signal which is at a high level during the first phase and the first stage of the second phase, and is at a low level during the second stage of the second phase. The second fifth switch ph22 is controlled by the fifth clock signal, and the fifth clock signal and the fourth clock signal are non-overlapping clock signals. The sixth switch ph3 is controlled by a sixth clock signal, and the sixth clock signal is a control signal which is at a high level during the first phase and the second stage of the second phase, and is at a low level during the first stage of the second phase. The open-loop gain of the second Opamp A2 is greater than that of the first Opamp A1. It is to be noted that compared with FIG. 3, FIG. 7 mainly makes an improvement on the level shifting module 220, and the CDS integration module 210 is essentially unchanged.

A circuit principle of the CDS integrating circuit 200 in the embodiments of the disclosure is described in conjunction with FIG. 7. A timing diagram corresponding to each switch in FIG. 7 is also as shown in FIG. 4, and the timing diagram corresponding to FIG. 7 adds the timing diagram of the sixth switch ph3 compared with FIG. 3. The circuit principle is described in conjunction with FIG. 7 and FIG. 4. During the first phase, the sixth switch ph3 is in the on state, the fourth switch ph21 is in the on state, and the input offset voltage Vos2 of the second Opamp A2 is stored by the energy storage capacitor C2. During the first stage of the second phase, the sixth switch ph3 is in the off state, the fourth switch ph21 is in the on state, and the level shifting capacitor C_cls samples the output signal Vout and the output end Vout2_int of the second Opamp A2, that is, sampling Vout-Vout2_int. In FIG. 7, during the first phase, the Opamp input offset voltage Vos1 of the first Opamp A1 is stored on the sampling capacitor C1, and the Opamp input offset voltage Vos2 of the second Opamp A2 is stored on the energy storage capacitor C2. During the first stage of the second phase, Vos1 is eliminated by the first Opamp A1. During the second stage of the second phase, Vos2 is eliminated by the second Opamp A2. In FIG. 3, it is equivalent to the first Opamp A1 acting twice, and in FIG. 7, the first Opamp A1 acts once, and the second Opamp A2 acts once, so that the final loop gain obtained in FIG. 7 is as follows:

$$(C1/C\_int)^2 * A1 * A2$$

Where A2 is the open-loop gain of the second Opamp A2. Due to the fact that the open-loop gain of the second Opamp A2 is greater than the open-loop gain A1 of the first Opamp A1, the loop gain in FIG. 7 may be further increased compared with that in FIG. 3.

Figure 8:
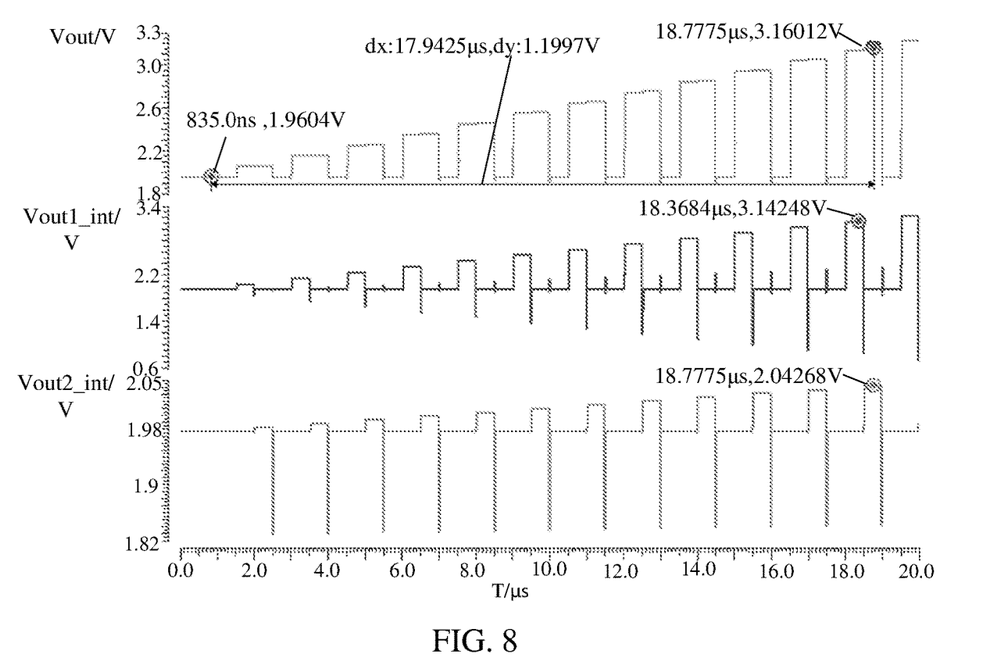
FIG. 8 shows a schematic diagram of waveforms corresponding to a CDS integrating circuit in FIG. 7.

In order to further describe the beneficial effect of the CDS integrating circuit 200 in the embodiments of the disclosure, as shown in FIG. 8, a schematic diagram of waveforms of the output signal Vout corresponding to the CDS integrating circuit 200 in FIG. 7, the output end Vout1_int of the first Opamp A1, and the output end Vout2_in of the second Opamp A2 obtained by performing simulation under the same parameters as those in FIG. 3 (the difference between the first input signal Vinp and the second input signal Vinn is 200 mv, the capacitance ratio of the integrating capacitor C_int to the sampling capacitor C1 is 2, the open-loop gain of the first Opamp A1 is 40 dB, and the open-loop gain of the second Opamp A2 is 60 dB) is given. The cumulative change of the output signal Vout in FIG. 8 is 1.1997 V, which is closer to the ideal value of 1.2 V than that in FIG. 6, so that the effect of eliminating the offset voltage of the CDS integrating circuit 200 in FIG. 7 is better than that in FIG. 3. In addition, as can be seen from FIG. 8, the swing of the output end Vout1_int of the first Opamp A1 is relatively large, and the swing of the output end Vout2_int of the second first Opamp A2 is relatively small.

The reasons for improving FIG. 3 to FIG. 7 are as follows: in FIG. 3, the first Opamp A1 needs to have a wide output swing, and in general, the wide output swing and the high open-loop gain cannot be met at the same time, so that the gain of the first Opamp A1 is also limited under the limitation of the wide output swing; and for the CDS integrating circuit 200 in FIG. 7, it can be seen from the waveform diagram in FIG. 8, the second Opamp A2 does not need to have a wide output swing, so that the open-loop gain of the second Opamp A2 may be greater than that of the first Opamp A1, and the loop gain in FIG. 7 may be higher than that in FIG. 3 on the whole.

In summary, the CDS integrating circuit in the embodiments of the disclosure increases the loop gain by adding the level shifting module, and improves the effect of eliminating the offset voltage when the open-loop gain of the Opamp is limited, thereby solving the problem of integrator leakage.

Further, the embodiments of the disclosure further provide a data converter. The converter includes the CDS integrating circuit in the embodiments of the disclosure. The data converter may be an analog-to-digital converter or a precision analog-to-digital converter.

The flowcharts and block diagrams in the drawings illustrate the architecture, functionality, and operation of apparatus and method that may be realized according to various embodiments of the disclosure. In this regard, each block in the flowchart or block diagram may represent a module, a program segment or a portion of an instruction, which includes one or more executable instructions for implementing the specified logic function. In some alternative implementations, the functions marked in the blocks may also occur in a different order from those marked in the drawings. For example, two blocks shown in succession may, in fact, be executed substantially in parallel, and sometimes in a reverse order, depending upon the functionality involved. It is also to be noted that each block in the block diagram and/or flowchart, and a combination of blocks in the block diagram or flowchart may be implemented by a special purpose hardware-based system which performs a specified function or operation, or a combination of special purpose hardware and computer instructions.

Unless otherwise indicated clearly in the context, the singular form of terms used herein and in the appended claims includes the plural, and vice versa. Therefore, when referring to the singular, it usually includes the plural of the corresponding term. Similarly, the words "include" and "comprise" will be interpreted as inclusive rather than exclusive. Similarly, the terms "include" and "or" shall be interpreted as including, unless such interpretation is expressly prohibited herein. Where the term "example" is used herein, particularly when it is behind a group of terms, the "example" is only exemplary and illustrative, and should not be considered exclusive or extensive.

Further aspects and scope of adaptability become apparent from the description provided herein. It is to be understood that various aspects of the disclosure may be implemented separately or in combination with one or more other aspects. It is also to be understood that the description and specific embodiments herein are for illustrative purposes only and are not intended to limit the scope of the disclosure.

Several embodiments of the disclosure have been described in detail above. However, apparently, those skilled in the art can make various modifications and variants to the embodiments of the disclosure without departing from the spirit and scope of the disclosure. The scope of the disclosure is limited by the appended claims.

What is claimed is:

1. A Correlated Double Sampling (CDS) integrating circuit, wherein the CDS integrating circuit integrates a difference between a first input signal and a second input signal to obtain an output signal, and the CDS integrating circuit comprises a CDS integration module and a level shifting module;

wherein the CDS integration module is configured to sample the first input signal and an Operational Amplifier (Opamp) input offset voltage to a sampling capacitor during a first phase; and sample the second input signal and the Opamp input offset voltage to the sampling capacitor during a second phase, and transfer a charge difference generated on the sampling capacitor to an integrating capacitor, wherein the first phase and the second phase are two stages controlled by a first clock signal and a second clock signal that are non-overlapping, and the Opamp input offset voltage is an input offset voltage of a first Opamp; and the level shifting module is configured to sample the output signal and a common-mode voltage to a level shifting capacitor during a first stage of the first phase and the second phase, and shift a potential of an Opamp output voltage in a direction of the common-mode voltage through the level shifting capacitor in a second stage of the second phase, so as to increase a loop gain;

wherein the CDS integration module comprises:
two first switches,
two second switches,
a third switch,
the sampling capacitor,
the integrating capacitor,
the first Opamp, and
a first offset voltage source, wherein
one end of the first first switch is coupled to the first input signal, and the other end of the first first switch is coupled to one end of the sampling capacitor; one end of the first second switch is coupled to the second input signal, and the other end of the first second switch is coupled to one end of the sampling capacitor; one end of the second first switch is coupled to one end of the first offset voltage source and one end of the second second switch, the other end of the second first switch is respectively coupled to the output signal, one end of the integrating capacitor, and the level shifting module, and a voltage corresponding to the first offset voltage source is the Opamp input offset voltage; the other end of the second second switch is coupled to the other end of the integrating capacitor; one end of the third switch is coupled to the other end of the sampling capacitor, and the other end of the third switch is coupled to one end of the second second switch; a positive input end of the first Opamp is coupled to the common-mode voltage, a negative input end of the first Opamp is coupled to the other end of the first offset voltage source, and an output end of the first Opamp is coupled to the level shifting module;

wherein the level shifting module comprises:
three fourth switches,
a second fifth switch,
a sixth switch,
the level shifting capacitor,
a second Opamp,
an energy storage capacitor, and
a second offset voltage source, wherein
one end of the third fourth switch is coupled to one end of the second second switch and one end of the energy storage capacitor, and the other end of the third fourth switch is respectively coupled to one end of the first offset voltage source, one end of the second first switch, and one end of the second fifth switch; one end of the fourth fourth switch is respectively coupled to the output end of the first Opamp and the other end of the second fifth switch, and the other end of the fourth fourth switch is coupled to one end of the level shifting capacitor, the output signal, and the CDS integration module; one end of the fifth fourth switch is respectively coupled to one end of the sixth switch and one end of the second offset voltage source, the other end of the fifth fourth switch is coupled to the other end of the level shifting capacitor and the output end of the second Opamp, and the second offset voltage source corresponds to an input offset voltage of the second Opamp; the other end of the sixth switch is coupled to the other end of the energy storage capacitor; and a negative input end of the second Opamp is coupled to the other end of the second offset voltage source, and a positive input end of the second Opamp is coupled to the common-mode voltage.

2. The CDS integrating circuit according to claim 1, wherein a closing stage of the first switch corresponds to the first phase, and the first switch is controlled by the first clock signal; a closing stage of the second switch corresponds to the second phase, and the second switch is controlled by the second clock signal; and the third switch is controlled by a third clock signal, and the third clock signal is a control signal which is at a low level during the switching between the first phase and the second phase.

3. The CDS integrating circuit according to claim 1, wherein the fourth switch is controlled by a fourth clock signal, and the fourth clock signal is a control signal which is at a high level during the first phase and the first stage of the second phase, and is at a low level during the second stage of the second phase; the second fifth switch is controlled by a fifth clock signal, and the fifth clock signal and the fourth clock signal are non-overlapping clock signals; and the sixth switch is controlled by a sixth clock signal, and the sixth clock signal is a control signal which is at a high level during the first phase and the second stage of the second phase, and is at a low level during the first stage of the second phase.

4. A Correlated Double Sampling (CDS) integrating circuit, wherein the CDS integrating circuit integrates a difference between a first input signal and a second input signal to obtain an output signal, and the CDS integrating circuit comprises a CDS integration module and a level shifting module;

wherein the CDS integration module is configured to sample the first input signal and an Operational Amplifier (Opamp) input offset voltage to a sampling capacitor during a first phase; and sample the second input signal and the Opamp input offset voltage to the sampling capacitor during a second phase, and transfer a charge difference generated on the sampling capacitor to an integrating capacitor, wherein the first phase and the second phase are two stages controlled by a first clock signal and a second clock signal that are non-overlapping, and the Opamp input offset voltage is an input offset voltage of a first Opamp; and the level shifting module is configured to sample the output signal and a common-mode voltage to a level shifting capacitor during a first stage of the first phase and the second phase, and shift a potential of an Opamp output voltage in a direction of the common-mode voltage through the level shifting capacitor in a second stage of the second phase, so as to increase a loop gain;
wherein the level shifting module comprises:
two fourth switches,
a first fifth switch, and
the level shifting capacitor, wherein
one end of the first fourth switch is coupled to the common-mode voltage, and the other end of the first fourth switch is respectively coupled to one end of the first fifth switch and one end of the level shifting capacitor; one end of the second fourth switch is respectively coupled to the output end of the first Opamp and the other end of the first fifth switch, and the other end of the second fourth switch is respectively coupled to the CDS integration module, the other end of the level shifting capacitor, and the output signal;
wherein the fourth switch is controlled by a fourth clock signal, and the fourth clock signal is a control signal which is at a high level during the first phase and the first stage of the second phase, and is at a low level during the second stage of the second phase; the first fifth switch is controlled by a fifth clock signal, and the fifth clock signal and the fourth clock signal are non-overlapping clock signals;

wherein the loop gain is:

$$(C1/C\_int)^2 * A1^2$$

Where C1 is a capacitance value of the sampling capacitor, C_int is a capacitance value of the integrating capacitor, and A1 is an open-loop gain of the first Opamp.

5. The CDS integrating circuit according to claim 3, wherein the loop gain is:

$$(C1/C\_int)^2 * A1 * A2,$$

wherein C1 is a capacitance value of the sampling capacitor, C_int is a capacitance value of the integrating capacitor, A1 is an open-loop gain of the first Opamp, A2 is an open-loop gain of the second Opamp, and the open-loop gain of the second Opamp is greater than that of the first Opamp.

6. A data converter, comprising the CDS integrating circuit according to claim 1.

* * * * *